(12) United States Patent
Tobise

(10) Patent No.: US 7,943,245 B2
(45) Date of Patent: May 17, 2011

(54) ORGANIC ELECTROLUMINESCENT DEVICE

(75) Inventor: Manabu Tobise, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1158 days.

(21) Appl. No.: 11/638,561

(22) Filed: Dec. 14, 2006

(65) Prior Publication Data

US 2007/0138953 A1    Jun. 21, 2007

(30) Foreign Application Priority Data

Dec. 16, 2005  (JP) ................. 2005-363442
Jan. 26, 2006  (JP) ................. 2006-017952

(51) Int. Cl.
*H01L 51/52* (2006.01)
*H01L 51/54* (2006.01)

(52) U.S. Cl. ........... 428/690; 428/917; 313/506; 257/40

(58) Field of Classification Search ........... 428/690, 428/917; 313/506; 257/40
See application file for complete search history.

(56) References Cited

U.S. PATENT DOCUMENTS 6,391,482 B1 * 5/2002 Matsuo et al. ............... 428/690

FOREIGN PATENT DOCUMENTS

| JP | 2000-3790 A | 1/2000 |
| JP | 2000-243571 A | 9/2000 |
| JP | 2004-273163 A | 9/2004 |

* cited by examiner

*Primary Examiner* — David Wu
*Assistant Examiner* — Vu A Nguyen
(74) *Attorney, Agent, or Firm* — Birch, Stewart, Kolasch & Birch, LLP.

(57) ABSTRACT

The invention provides an organic electroluminescent device having high luminous efficiency, being able to drive at a low voltage and being excellent in driving durability including, between an anode and cathode, a luminescent layer containing a luminescent material, an electron-transport layer (ETL1) and an organic thin film layer (ETL2) in this order from the anode side, wherein the organic thin film layer (ETL2) contains an electron-transport material and has a thickness of 0.01 to 3 nm, and the ratio (ETL1/ETL2) of the thickness of the electron-transport layer (ETL1) to the thickness of the organic thin film layer (ETL2) is in the range of 5 to 500.

6 Claims, No Drawings

ORGANIC ELECTROLUMINESCENT DEVICE

CROSS REFERENCE TO RELATED APPLICATIONS

This application claims priority under 35 USC 119 from Japanese Patent Application No. 2005-363442 and No. 2006-017952, the disclosures of which are incorporated herein by reference.

BACKGROUND OF THE INVENTION

1. Field of the Invention

The invention relates to an organic electroluminescent device (hereinafter, also referred to as "organic EL device", "luminescent device" or "EL device") that emits a light by converting an electric energy into a light.

2. Description of the Related Art

Research and development of various display devices have become active today, and among these, organic electroluminescent devices (EL devices) have been focused as promising devices among various devices since the EL device is able to emit a quite bright light at a low voltage.

The organic electroluminescent device is composed of an electroluminescent layer or a pair of counter electrodes interposed with a luminescent layer or a plurality of organic layers including the luminescent layer. The organic electroluminescent device uses light emission from excitons generated by recombination of electrons injected from a cathode and holes injected from an anode in the luminescent layer, or uses light emission from excitons of other molecules generated by energy transfer from the excitons.

Characteristics required for the organic electroluminescent device include high luminous efficiency, low driving voltage and high durability (long service life).

With respect to high luminous efficiency and long service life, a technology for providing an electron-transporting control layer for suppressing electrons from flowing into the luminescent layer has been disclosed (see, for example, Japanese Patent Application Laid-Open (JP-A) No. 2004-273163).

In another art, luminous efficiency is improved by preventing the holes from leaking by providing a hole blocking layer (see, for example, JP-A Nos. 2000-243571 and 2000-3790).

However, luminous efficiency, driving voltage and durability cannot be considered to be sufficient in any of the organic electroluminescent devices disclosed in the above-mentioned patent publications, and further improvements of the characteristics are required.

SUMMARY OF THE INVENTION

The invention provides an organic electroluminescent device comprising a luminescent layer containing a luminescent material, an electron-transport layer (ETL1) and an organic thin film layer (ETL2) adjoining the electron-transport layer (ETL1) in this order from the anode side between an anode and a cathode, wherein the organic thin film layer (ETL2) contains an electron transporting material and has a thickness of 0.01 to 3 nm, and the ratio (ETL1/ETL2) of the thickness of the electron-transport layer (ETL1) to the thickness of the organic thin film layer (ETL2) is in the range of 5 to 500.

The invention also provides the above-mentioned organic electroluminescent device comprising a luminescent layer containing a luminescent material, an electron-transport layer (ETL1) and an organic thin film layer (ETL2) in this order from the anode side between a pair of electrodes, wherein the organic thin film layer (ETL2) contains an electron transporting material and has a thickness of 0.01 to 3 nm, the ratio (ETL1/ETL2) of the thickness of the electron-transport layer (ETL1) to the thickness of the organic thin film layer (ETL2) is in the range of 5 to 500, electron affinity (ETL1 (Ea)) of the electron-transport layer (ETL1) and electron affinity (ETL2 (Ea)) of the organic thin film layer (ETL2) satisfy the relationship represented by equation (1) below, and the organic thin film layer (ETL2) adjoins the anode layer:

$$ETL1(Ea) > ETL2(Ea) \qquad (1)$$

DESCRIPTION OF THE PREFERRED EMBODIMENTS

The organic electroluminescent device of the invention will be described in detail by dividing into a first aspect and a second aspect.

(First Aspect)

The organic electroluminescent device according to the first aspect of the invention comprises a luminescent layer containing a luminescent material, an electron-transport layer (ETL1) and an organic thin film layer (ETL2) adjoining the electron-transport layer (ETL1) in this order from the anode side, wherein the organic thin film layer (ETL2) contains an electron transporting material and has a thickness of 0.01 to 3 nm, and the ratio (ETL1/ETL2) of the thickness of the electron-transport layer (ETL1) to the thickness of the organic thin film layer (ETL2) is in the range of 5 to 500.

The organic electroluminescent device of the invention having the above-mentioned construction is able to improve luminous efficiency while excellent effect may be manifested with respect to lowering of the driving voltage and driving durability.

While the function of the invention has not been clarified yet, it may be conjectured that improvement of luminous efficiency, lowering of the driving voltage and improvement of driving durability are possible by forming the device into the above-mentioned construction since injection of electrons from the electrode is enhanced while durability of the device can be effectively suppressed from being deteriorated.

The electron-transport layer (ETL1) in the invention has a function for receiving electrons from the cathode side and transporting the electrons to the anode side. Other electron-transport layers may be interposed between the luminescent layer and electron-transport layer (ETL1).

The organic thin film layer (ETL2) is provided between the electron-transport layer (ETL1) and cathode. The organic thin film layer contains an electron transporting material with a required thickness of 0.01 to 3 nm. Other organic thin film layers may be interposed between the cathode and organic thin film layer (ETL2).

The electron-transport layer (ETL1) and organic thin film layer (ETL2) are preferably the layers adjoining to each other.

The electron-transport layer (ETL1) and organic thin film layer (ETL2) may be simply referred to as "ETL1 layer" and "ETL2" layer in the descriptions hereinafter.

According to the invention, the ratio of thickness (ETL1/ETL2) between the thickness of the electron-transport layer (ETL1) and the thickness of the organic thin film layer (ETL2) should be in the range of 5 to 500. The ratio is preferably in the range of 7 to 70, more preferably 10 to 50.

The thickness of the ETL1 layer is preferably in the range of 10 to 50 nm, more preferably 10 to 40 nm, and further preferably 10 to 30 nm.

When the organic electroluminescent device of the invention comprises other electron-transport layers in addition to the ETL1 layer, the thickness of the total electron-transport layer is preferably as small as possible since the mobility of electrons are smaller than the mobility of holes. The thickness is more preferably in the range of 20 to 60 nm, further preferably 20 to 30 nm.

The thickness of the ETL2 layer is in the range of 0.01 to 3 nm, more preferably 0.05 to 2 nm, and further preferably 0.5 to 1 nm.

The total thickness of the organic compound layer including the ELT2 layer and other organic compound layers is more preferably 100 to 400 nm, further preferably 200 to 350 nm, from the viewpoint of the driving voltage.

The thickness of each of the ETL1 layer and the thickness of ETL2 layer is determined so as to satisfy the above-mentioned ratio (ETL1/ETL2) of the thickness.

The organic thin film layer may be formed into a film with a uniform or uneven thickness, or may be discontinuously formed with respect to the formed surface (for example as islets).

The thickness in the invention refers to an average thickness. The thickness is specifically determined by forming a single layer of each material constituting each layer with a thickness of about 50 to about 200 nm, and the thickness is measured by means of a step height meter or an optical thickness meter. The thickness of each layer for manufacturing the device is determined from an equivalent value of thickness of each single layer.

Alternatively, the thickness is measured with a stylus surface configuration meter (trade name: DEKTAL, manufactured by ULVAC, Inc.).

Electron affinity (ETL1 (Ea)) of the ETL1 layer and electron affinity (ETL2 (Ea)) of the ETL2 layer preferably satisfies the relationship represented by equation (1) below from the viewpoint of reducing the barrier difference of electron affinity between ETL1 and cathode:

$$ETL1(Ea) < ETL2(Ea) \quad (1)$$

When ETL1 and ETL2 satisfy above-mentioned equation (1), the value of ETL1 (Ea)−ETL2 (Ea) is more preferably in the range of 0.01 to 0.3 eV, further preferably 0.01 to 0.2 eV.

In the present invention, the electron affinity (Ea) of each layer denotes the electron affinity of the material which is the principal component in the layer.

A band gap is calculated from an absorption spectrum of a single layer film, and electron affinity is determined from an independently measured ionization potential (IP) and then the electron affinity Ea is defined from the determined value. The ionization potential is measured at room temperature under an atmospheric pressure using AC-1 (trade name, manufactured by Riken Keiki Co. Ltd.). The measuring principle of AC-1 is described in "Data Sheet of Work Function of Organic Thin Film" by Chihaya Adachi, published by CMC publishing Co., 2004.

Electron mobility of the ETL2 layer is preferably in the range of $2.0 \times 10^{-5}$ cm$^2$/Vs or more to $1.0 \times 10^{-2}$ cm$^2$/Vs or less, more preferably $1.0 \times 10^{-4}$ cm$^2$/Vs or more to $1.0 \times 10^{-3}$ cm$^2$/Vs or less, and further preferably $5.0 \times 10^{-4}$ cm$^2$/Vs or more to $3.0 \times 10^{-3}$ cm$^2$/Vs or less from the viewpoint of carrier balance between the hole and electron in the luminescent layer.

Electron mobility of the ETL1 layer is preferably in the range of $2.0 \times 10^{-5}$ cm$^2$/Vs or more to $1.0 \times 10^{-2}$ cm$^2$/Vs or less, more preferably $1.0 \times 10^{-4}$ cm$^2$/Vs or more to $1.0 \times 10^{-3}$ cm$^2$/Vs or less, and further preferably $5.0 \times 10^{-4}$ cm$^2$/Vs or more to $3.0 \times 10^{-3}$ cm$^2$/Vs or less as in the ETL2 layer from the viewpoint of carrier balance between the hole and electron in the luminescent layer.

According to the invention, examples of the electron transporting material contained in the ETL1 layer include aromatic tetracarboxylic acid anhydrides such as triazole derivatives, oxazole derivatives, oxadiazole derivatives, imidazole derivatives, fluorenone derivatives, anthraquinodimethane derivatives, anthrone derivatives, diphenylquinone derivatives, thiopyrane dioxide derivatives, carbodiimide derivatives, fluorenylidene derivatives, distyryl pyrazine derivatives, naththalene and perylene; various metal complexes represented by metal complexes of phthalocyanine derivatives and 8-quinolinol derivatives, metallophthalocyanine, and metal complexes having benzoxazole and benzothiazole as ligands, organic silane derivatives or the like.

The ETL1 layer is preferably a layer containing a metal complex from the viewpoint of durability against electrons flowing in the material. The metal complex is preferably a metal complex of 8-quinolinol derivatives, or a metal complex having benzoxazole or benzothiazole as a ligand.

When the organic electroluminescent device of the invention comprises other electron-transport layer between the electroluminescent layer and ETL1 layer in addition to the ETL1 layer, examples of the electron transfer material contained in other electron-transport layers include triazole derivatives, oxazole derivatives, oxadiazole derivatives, imidazole derivatives, fluorenone derivatives, anthraquinodimethane derivatives, anthrone derivatives, diphenyl quinone derivatives, thiopyranedioxide derivatives, carbodiimide derivatives, fluorenylidene derivatives, distyryl pyrazine derivatives, aromatic tetracarboxylic acid anhydrides such as naphthalene and perylene, and various metal complexes represented by metal complexes of phthalocyanine derivatives and 8-quinolinol derivatives, metallophthalocyanine, and metal complexes having benzoxazole and benzothiazole as ligands, or organic silane derivatives or the like.

Since other electron-transport layers (layers between the luminescent layer and ETL1 layer) are used for alleviating the barrier of electron affinity between the luminescent layer and ETL1 layer, or serve for blocking the holes from being transferred from the luminescent layer, electron affinity and ionization potential preferably satisfy the relationship represented by equation (2) or (3) below:

$$\text{luminescent layer}(Ea) < \text{other electron-transport layer}(Ea) < ETL1(Ea) \quad (2)$$

$$\text{luminescent layer}(Ip) < \text{other electron-transport layer}(Ip) \quad (3)$$

Examples of the electron transporting material contained in the organic thin film layer include triazole derivatives, oxazole derivatives, oxadiazole derivatives, imidazole derivatives, fluorenone derivatives, anthraquinodimethane derivatives, anthrone derivatives, diphenylquinone derivatives, thiopyrane dioxide derivatives, carbodiimide derivatives, fluorenylidene methane derivatives, distyryl pyrazine derivatives, aromatic tetracarboxylic acid anhydrides such as naphthalene and perylene, phthalocyanine derivatives, phenanthroline derivatives, various metal complexes represented by metal complexes of 8-quinolynol derivatives, metal phthalocyanine, and metal complexes having benzoxazole and benzothiazole as ligands, and organic silane derivatives. These materials preferably satisfy equation (1) from the viewpoint of reducing the barrier difference between the ETL1 and cathode.

As a preferable combination of the electron transporting materials contained in the electron-transport layer (ETL1)

and organic thin film layer (ETL2), the electron transporting material contained in the ETL1 layer is a metal complex of a 8-quinolinol derivative or a metal complex having benzoxazole or benzothiazole as a ligand, and the electron transporting material contained in the ETL2 layer is a phenanthroline derivative or a metal complex of a 8-quinolynol derivative from the view point of durability of the material against the electrons flowing in the material. The combination of the 8-quinolinol derivative as the electron transporting material contained in the ETL1 layer and the phenanthroline derivative as the electron transporting material contained in the ETL2 layer is more preferable.

The constitution used in the organic electroluminescent device of the invention will be described in more detail hereinafter.

The organic electroluminescent device of the invention comprises a luminescent layer, electron-transport layers (ETL1 layer, or ETL1 layer and other electron-transport layers) and organic thin film layers (ETL2 layer, or ETL2 layer and other organic thin film layers) in this order between the anode and cathode in this order from anode side.

The cathode and anode are preferably formed on a substrate. Other organic compound layers may be interposed between the anode and cathode in addition to those described above.

At least one electrode of the anode and cathode is preferably transparent considering the features of the luminescent device. The anode is usually transparent.

As a specific aspect of lamination of the organic luminescent device of the invention, the hole-transport layer, luminescent layer, electron-transport layer and organic thin film layer are preferably laminated in this order. A charge block layer may be laminated between the hole-transport layer and luminescent layer.

Each layer including the luminescent layer provided between the anode and cathode may be collectively named as "organic compound layers" in the descriptions below.

Substrate

The substrate available for the invention preferably does not scatter or attenuate the light emitted from the luminous layer. Specific examples of the substrate include inorganic materials such as zirconia-stabilized yttrium (YSZ) and glass, and organic materials such as polyesters including polyethylene terephthalate, polybutylene phthalate and polyethylene naphthalate, polystyrene, polycarbonate, polyether sulfone, polyallylate, polyimide, polycycloolefin, norbornene resin and poly(chlorotrifluoroethylene).

When a glass is used for the substrate, a non-alkali glass is preferably used as the material in order to reduce solubilized ions from the glass. A soda lime glass is preferably used after applying a barrier coat such as silica. Organic materials are preferably excellent in heat resistance, dimensional stability, solvent resistance, electric insulation and processability.

The shape, structure and size of the substrate are not particularly restricted, and may be appropriately selected depending on the uses and purpose of the luminescent device. The shape of the substrate is preferably a plate. The structure of the substrate may be either a monolayer structure or a laminated structure, and the substrate may be formed with a single member or a plurality of materials.

While the substrate may be either colorless and transparent or colored and transparent, a colorless and transparent substrate is preferable from the viewpoint of causing no scattering or attenuation of the light emitted from the luminescent layer.

A moisture permeation preventive layer (a gas barrier layer) may be provided on either the surface or back face of the substrate.

Inorganic substances such as silicon nitride and silicon oxide are favorably used for the moisture permeation preventive layer (gas barrier layer). The moisture permeation preventive layer (gas barrier layer) can be deposited by, for example, high frequency sputtering.

A hard coat layer and an under-coat layer may be provided when a thermoplastic substrate is used.

Anode

The anode may usually function as an electrode for supplying the holes to the organic compound layer. The shape, structure and size of the anode are not particularly restricted, and the material may be appropriately selected from known electrode materials. The anode is usually provided as a transparent anode as described above.

Examples of the favorable material of the anode include metals, alloys, metal oxides, conductive compounds and mixtures thereof, and the material preferably has work function of 4.0 eV or more. Specific examples of the anode material include conductive metal oxides such as tin oxide doped with antimony or fluorine (ATO, FTO), tin oxide, zinc oxide, indium oxide, indium tin oxide (ITO) and indium zinc oxide (IZO); metals such as gold, silver, chromium and nickel; mixtures or laminates of these metals with conductive metal oxides; inorganic conductive substances such as copper iodide and copper sulfide; organic conductive materials such as polyaniline, polythiophene and pyrrole; and laminates of ITO and these organic conductive materials. The conductive metal oxides are preferable among them, and ITO is particularly preferable from the viewpoint of productivity, high conductivity and transparency.

The anode may be formed on the substrate according to a an appropriately selected method from the methods comprising a wet method such as printing method and coating method, physical method such as vacuum vapor deposition, sputtering and ion plating and chemical method such as CVD and plasma CVD by taking the material constituting the anode and aptitude of the material into consideration. When ITO is selected as the material of the anode, for example, the anode may be deposited by high frequency sputtering, vacuum vapor deposition or ion plating.

The position for forming the anode is not particularly restricted in the organic electroluminescent material of the invention, and may be appropriately selected depending on the use and purpose of the luminescent device. However, the anode is preferably formed on the substrate. The anode may be formed either on the entire surface or a part of the surface at one side of the substrate.

The anode may be patterned by chemical etching such as photolithography or by physical etching using a laser. Alternatively, the anode may be patterned by vacuum vapor deposition or sputtering with a mask laid on the substrate, or by a lift-off method or printing method.

The thickness of the anode may be appropriately selected depending on the material constituting the anode. While the thickness cannot be uniquely defined, it is usually in the range of about 10 nm to 50 μm, preferably 50 nm to 20 μm.

The resistivity of the anode is preferably 103 Ω/sq. or less, more preferably 102 Ω/sq. or less. The anode may be colorless and transparent, or colored and transparent. Transmittance of the anode is preferably 60% or more, more preferably 70% or more, for obtaining an emitted light from the transparent anode side.

The transparent anode is described in "New Prospect of Transparent Conductive Film", edited by Yutaka Sawada, published by CMC Co., Ltd. 1999, and descriptions therein may be applied to the invention. ITO or IZO is used when a plastic substrate having low heat resistance is used, and the anode is preferably deposited at a low temperature of 150° C. or less in order to obtain a transparent anode.

Cathode

The cathode may have a function as an electrode for injecting the electrons into the organic compound layer, and the shape, structure and size of the cathode are not particularly restricted. The material for the cathode is appropriately selected from known electrode materials.

Examples of the material constituting the cathode include metals, alloys, metal oxides, conductive compounds and mixtures thereof, and the material preferably has a work function of 4.5 eV or less. Specific examples of the material of the cathode include alkali metals (for example, Li, Na, K and Cs), alkali earth metals (for example Mg and Ca), gold, silver, lead, aluminum, sodium-potassium alloy, lithium-aluminum alloy, magnesium-silver alloy, and rare earth metal metals such and indium and ytterbium. While one of them may be used alone, two or more kinds of them can be favorably used in combination for allowing both the stability and electron injectability to be compatible to one another.

Among these, the alkali metal and alkali earth metal are preferable among them as the material for constituting the anode, and a material mainly comprising aluminum is preferable from the viewpoint of storage stability.

The material mainly comprising aluminum refers to aluminum alone, an alloy of aluminum with 0.01 to 10% by mass of the alkali metal or alkali earth metal or a mixture of these alloys (for example, lithium-aluminum alloy, magnesium-aluminum alloy).

The anode materials are described in detail in JP-A Nos. 2-15595 and 5-121172, and these patent publications are incorporated herein by way of reference.

The method for forming the anode is not particularly restricted, and known methods may be used. For example, the anode may be formed according to an appropriately selected method from the methods comprising a wet method such as printing and coating, physical method such as vacuum vapor deposition, sputtering and ion plating and chemical method such as CVD and plasma CVD by taking the material constituting the cathode and aptitude of the material into consideration. For example, when a metal is selected as the material of the cathode, one or two or more kinds of them may be simultaneously or sequentially sputtered.

The cathode may be patterned by chemical etching such as photolithography or by physical etching using a laser. Alternatively, the anode may be patterned by vacuum vapor deposition or sputtering with a mask laid on the substrate, or by a lift-off method or printing method.

The position for forming the cathode is not particularly restricted in the organic electroluminescent material of the invention. The cathode may be formed either on the entire surface or on a part of the surface of the organic compound layer.

A dielectric layer containing a fluoride or an oxide of an alkali metal or alkali earth metal with a thickness of 0.1 to 5 nm may be interposed between the cathode and organic thin film layer. The dielectric layer may be considered to be a kind of the electron injection layer. The dielectric layer may be deposited by the vacuum vapor deposition method, sputtering method or ion plating method.

The thickness of the cathode may be appropriately selected depending on the material constituting the cathode. While the thickness cannot be uniquely defined, it is usually in the range of about 10 nm to 5 μm, preferably 50 nm to 1 μm.

The cathode may be transparent or opaque. The transparent electrode can be formed by depositing the material of the cathode at a thickness of 1 to 10 nm, and by further depositing a transparent conductive material such as ITO and IZO thereon.

Organic Compound Layer

While the organic electroluminescent device of the invention comprises at least a luminescent layer, an electron-transport layer and an organic thin film layer, other layers may also be included in the layer as described above. Examples of other layers include a hole-transport layer, charge block layer and hole injection layer. Details of these layers will be described in detail hereinafter.

—Deposition of Organic Compound Layer—

Each layer constituting the organic electroluminescent device of the invention can be favorably deposited by a dry vapor deposition method such as vapor deposition method and sputtering method, transcription method or printing method.

—Electron-transport Layer and Organic Thin Film Layer—

Details of the electron-transport layer (ETL1 layer, or ETL1 layer and electron-transport layer) and organic thin film layer (ETL2 layer, or ETL2 layer and other organic thin film layers) are as described previously.

—Luminescent Layer—

The luminescent layer has a function for receiving the holes from the anode, hole injection layer or hole-transport layer and for receiving the electrons from the cathode, electron injection layer or electron-transport layer by applying an electric field, and for emitting a light by recombination of the hole and electron.

The luminescent layer of the invention contains a luminescent material, and preferably contains a host material and the luminescent material as dopants.

The luminescent material is more preferably a phosphorescent material.

While the host material is not particularly restricted, it is preferably a charge transporting material.

The luminescent layer may comprise one layer or two or more layers.

The phosphorescent material that may be contained in the luminescent layer is usually a complex containing a transition metal or a lanthanoid atom.

While the transition metal atom is not particularly restricted, preferable examples include ruthenium, rhodium, palladium, tungsten, rhenium, osmium, iridium and platinum, and rhenium, iridium and platinum are more preferable.

Preferable examples of the lanthanoid atom include lanthanum, cerium, praseodymium, neodymium, samarium, europium, gadolinium, terbium, dysprosium, holmium, erbium, thulium, ytterbium and ruthenium. Neodymium, europium and gadolinium are preferable among them.

Examples of the ligand include those described in Comprehensive Coordination Chemistry, by G. Wilkinson, Pergamon Press Co., 1987; Photochemistry and Photophysics of Coordination Compounds, by H. Yersin, Springer-Verlag Co., 1987; and Organometallic Chemistry—Basis and Application, by Akio Yamamoto, Shokabo Publishing Co., Ltd. 1982.

Specific examples of the ligand include halogen ligands (preferably chlorine ligand), nitrogen-containing heterocyclic ligands (for example phenyl pyridine, benzoquinoline, quinolimol, bipyridyl and phenanthroline), diketone ligands (for example acetylacetone), carboxylic acid ligands (for example acetic acid ligand), carbon monoxide ligand, isonitrile ligand and cyano ligand, more preferably the nitrogen-containing heterocyclic ligand. The above-mentioned complex may comprise one transition metal atom in the compound. Heterologous metal atoms may be contained together.

The phosphorescent material is preferably contained in the luminescent layer in a range of preferably 0.1 to 20% by volume, more preferably 0.5 to 10% by volume.

Examples of the host material capable of being incorporated in the luminescent layer of the invention include those having a carbazole skeleton, those having a diarylamine skeleton, those having a pyridine skeleton, those having a triazine skeleton and those having a arylsilane skeleton. While the material is not particularly restricted, those having the carbazole skeleton are preferable among them.

$T_1$ (the energy level at the lowest multiplet excitation state) of the host material is preferably larger than the $T_1$ level of the dopant material. A luminescent layer in which the dopant material is doped in the host material can be favorably formed by vapor co-deposition of the dopant material and host material.

While the thickness of the luminescent layer is not particularly restricted, it is usually in the range of preferably 1 nm to 500 nm, more preferably 5 nm to 200 nm, and further preferably 10 nm to 100 nm.

The host material is contained in the luminescent layer preferably in the range of 50 to 99.9% by volume, more preferably 70 to 99.9% by volume.

—Hole Injection Layer and Hole-Transport Layer—

The hole injection layer and hole-transport layer have a function for receiving the hole from the anode or anode side, and for transporting the hole to the cathode side. Providing the hole-transport layer at the anode side of the luminescent layer permits transport of the hole to be enhanced. Injection of the hole from the anode can be also enhanced by providing the hole injection layer at the anode side beyond the hole-transport layer.

Specifically, the hole injection layer and hole-transport layer preferably contain carbazole derivatives, triazole derivatives, oxazole derivatives, oxadiazole derivatives, imidazole derivatives, polyaryl alkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, stylylamine compounds, aromatic dimethylidene compound, porphyrin compounds, organic silane derivatives or carbon.

The thickness of each of the hole injection layer and hole-transport layer is preferably 50 nm or less from the viewpoint of reducing the driving voltage.

The thickness of the hole-transport layer is preferably in the range of 5 to 50 nm, more preferably 10 to 40 nm. The thickness of the hole injection layer is preferably in the range of 0.5 to 50 nm, more preferably 1 to 40 nm.

The hole injection layer and hole-transport layer may have a monolayer structure comprising one or two or more kinds of the above-mentioned materials, or a multilayer structure of a plurality of layers comprising the same composition or different compositions.

The hole injection layer and hole-transport layer may be often required to have a thickness of 100 nm or more for compensating the roughness of ITO when ITO is used as an anode of a bottom emission type. Since the hole injection layer and hole-transport layer become thick in this case, the driving voltage increases and transportability of the hole decreases to disturb the balance of the carrier in the luminescent layer. For preventing the carrier from being unbalanced, a P-dopant is injected into the hole injection layer and hole-transport layer in order to increase the number of the holes in the material. An example of the dope material is F4-TCNQ. The amount of doping is preferably in the range of 0.05 to 0.5% by volume, more preferably 0.1 to 0.3% by volume.

Protective Layer

The entire organic EL device may be protected with a protective layer in the invention.

The material contained in the protective layer may have a function for suppressing substances that accelerates deterioration of the device such as water and oxygen from invading into the device.

Specific examples of the material include metals such as In, Sn, Pb, Au, Cu, Ag, Al, Ti and Ni; metal oxides such as MgO, $SiO_2$, $Al_2O_3$, GeO, NiO, CaO, BaO, $Fe_2O_3$, $Y_2O_3$ and $TiO_2$; metal nitrides such as $SiN_x$ and $SiN_xO_y$; metal fluorides such as $MgF_2$, LiF, $AlF_3$ and $CaF_2$; homopolymers such as polyethylene, polypropylene, methyl polymethacrylate, polyimide, polyurea, polytetrafluoroethylene, polychlorotrifluoroethylene, polydichlorodifluoroethylene; copolymers such as a copolymer of chlorotrifluoroeethylene and dichlorodifluoroethylene, a copolymer obtained by copolymerization of tetrafluoroethylene with a mixture of monomers containing at least one comonomer and a fluorine-containing copolymer having a cyclic structure in the main chain of the copolymer; a substance with a water absorption coefficient of 1% or more; and a moisture-proof substance with a water absorption coefficient of 0.1% or less.

The method for forming the protective layer is not particularly restricted, and the methods available include a vacuum vapor deposition method, a sputtering method, a reactive sputtering method, an MBE (molecular beam epitaxy) method, a cluster ion-beam method, an ion plating method, a plasma polymerization method (high frequency ion plating method), a plasma CVD method, a laser CVD method, a thermal CVD method, a gas-source CVD method, a coating method, a printing method and a transcription method.

Sealing

The entire device of the organic electroluminescent device of the invention may be sealed using a sealing vessel.

A water absorbing agent or an inert liquid may be sealed in the space between the sealing vessel and luminescent device.

While the water absorbing agent is not particularly restricted, examples of them include barium oxide, sodium oxide, potassium oxide, calcium oxide, sodium sulfate, calcium sulfate, magnesium sulfate, phosphorous pentoxide, calcium chloride, magnesium chloride, copper chloride, cesium fluoride, niobium fluoride, calcium bromide, vanadium bromide, molecular sieve, zeolite and magnesium oxide. While the inert liquid is not particularly restricted, examples of them include paraffin, liquid paraffin, fluorinated solvents such as perfluoroalkane, perfluoroamine and perfluoroether, chlorinated solvents and silicone oil.

Second Aspect

The organic electroluminescent device of the invention comprises a luminescent layer containing a luminescent material, an electron-transport layer (ETL1) and an organic thin film layer (ETL2) in this order from the anode side between a pair of electrodes, wherein the organic thin film layer (ETL2) contains an electron transporting material and has a thickness of 0.01 to 3 nm, the ratio (ETL1/ETL2) between the thickness of the electron-transport layer (ETL1) and the thickness of the organic tin film layer (ETL2) is in the range of 5 to 500, electron affinity (ETL1 (Ea)) of the electron-transport layer (ETL1) and electron affinity (ETL2 (Ea)) of the organic thin film layer (ETL2) satisfy the following relationship represented by equation (4), and the organic thin film layer (ETL2) adjoins the cathode layer:

$$ETL1(Ea) > ETL2(Ea) \quad (4)$$

Such construction permits the organic electroluminescent device of the second aspect to manifest the same function and effect as those of the organic electroluminescent device of the first aspect. While the organic electroluminescent device of the second aspect is described hereinafter, the same construction as in the organic electroluminescent device of the first aspect can be appropriately applied to the construction in the organic electroluminescent device of the second aspect that is not particularly described.

The organic thin film layer (ETL2) is provided between the electron-transport layer (ETL1) and cathode, comprises an electron transporting material, and has a thickness of 0.01 to 3 nm. Electron affinity (ETL1 (Ea)) of the electron-transport layer (ETL1) and electron affinity (ETL2 (Ea)) of the organic thin film layer (ETL2) is required to satisfy the relationship represented by equation (4) below:

$$ETL1(Ea) > ETL2(Ea) \quad (4)$$

The organic thin film layer (ETL2) adjoins the cathode layer.

The "cathode layer" denotes both a region that has a function as the cathode and a region comprising the cathode and an inorganic compound layer formed by adjoining to the cathode. An example of the inorganic compound layer is a dielectric layer (electron injection layer) to be described below.

The electron-transport layer (ETL1) and organic thin film layer (ETL2) may be simply referred to "ETL1" and "ETL2" in the following description as in the organic electroluminescent device according to the first aspect.

The ratio of thickness (ETL1/ETL2) between the thickness of the electron-transport layer (ETL1) and the thickness of the organic thin film layer (ETL2) is required to be in the range of 5 to 500, preferably 10 to 70, and more preferably 20 to 50.

The thickness of ETL1 layer and the thickness of ETL2 layer, the ratio between them (ETL1/ETL2) and the configuration of the organic thin film layer of the second aspect are the same as those in the organic electroluminescent device according to the first aspect of the invention.

A thin layer having smaller electron affinity than ETL2 is provided in the invention in order to accelerate electron injection into ETL2. Electron affinity (ETL1 (Ea)) of ETL1 layer and electron affinity (ETL2 (Ea)) of ETL2 layer should satisfy the relationship represented by equation (4) below from the viewpoint of a tunnel effect caused by applying a high voltage:

$$ETL1(Ea) > ETL2(Ea) \quad (4)$$

When ETL1 (Ea) and ETL2 (Ea) satisfy the relationship represented by equation (4) above, the value of ETL1 (Ea)– ETL2 (Ea) is more preferably in the range of 0.01 to 0.9 eV, further preferably 0.01 to 0.3 eV.

Electron affinity of each layer, electron mobility of ETL2 layer and electron mobility of ETL1 layer in the second aspect are the same as those in the organic electroluminescent device according to the first aspect of the invention.

The electron transporting material contained in ETL1 layer is the same as the material in the organic electron luminescent device according to the first aspect of the invention. When the organic electron luminescent device comprises other electron-transport layers in addition to ETL1 layer, the electron transporting materials contained in the other electron-transport layer are the same as those in the organic electron luminescent device according to the first aspect of the invention. Since the other electron-transport layers (layers between the luminescent layer and ETL1 layer) are used for alleviating the barrier of electron affinity between the luminescent layer and ETL1 layer, and serve for blocking transfer of the hole from the luminescent layer, electron affinity and ionization potential also preferably satisfy the relationship represented by equation (2) or (3).

Examples of the electron transporting material contained in the organic thin film layer (ETL2) include pyrene, carbazole, imidazopyridine and derivatives thereof, triazole derivatives, oxazole derivatives, oxadiazole derivatives, imidazole derivatives, fluorenone derivatives, anthraquinone dimethane derivatives, anthrone derivatives, diphenylquinone derivatives, thiopyrane dioxide derivatives, carbodiimide derivatives, fluolenylidne methane derivatives, distyryl pyrane derivatives, naphthalene, aromatic tetracarboxylic acid anhydride of perylene, phthalocyanine derivatives, phenanthroline derivatives, metal complexes of 8-quinolinol derivatives, and various metal complexes represented by metal complexes of 2-(2-phenolato)imidazopyridine, metal phthalocyanine and metal complexes having a ligand such as benzoxazole and benzothiazole, organic silane derivatives or the like. The materials satisfying equation (4 are selected from the viewpoint of reducing the barrier difference of electron affinity between ETL1 and cathode.

It is particularly preferable that the organic thin film layer (ETL2) contains at least one selected from metal complexes of compounds consisting of pyrene, carbazole, imidazopyridine and derivatives thereof, and derivatives of 2-(2-phenolato)imidazopyridine among the above-mentioned materials from the viewpoint of durability of the material against the electrons flowing in the material.

In a preferable combination of the electron transporting materials contained in the electron-transport layer (ETL1) and organic thin film layer (ETL2), the electron transporting material contained in ETL1 layer is the metal complex of 8-quinolinol derivative or the metal complex having benzoxazole or benzothiazole as the ligand, and the electron transporting material contained in ETL2 layer is pyrene, carbazole, imidazopyridine or a derivative thereof, a aromatic tetracarboxylic acid anhydride of naphthalene, perylene or pyrene, or one of various metal complexes represented by the metal complex containing the 8-quinolinol derivative. In a more preferable combination, the electron transporting material contained in ETL1 layer is the metal complex of the 8-quinolinol derivative and the electron transporting material contained in ETL2 layer is bipyrene, carbazole, imidazopyridine and a derivative thereof, or a metal complex containing 2-(2-phenolato)imidazopyridine.

The construction applied to the organic electroluminescent device according to the second aspect of the invention will be described in more detail below.

The organic electroluminescent device according to the second aspect of the invention comprises a luminescent layer, an electron-transport layer (ETL1 layer, or ETL1 layer and other electron-transport layers) and an organic thin film layer (ETL2 layer) in this order from the anode side between a pair of electrodes.

The anode and substrate are the same as those in the organic electroluminescent device according to the first aspect of the invention.

The cathode layer according to the second aspect of the invention denotes both a region having the functions as the cathode and a region comprising the cathode and an inorganic compound layer formed adjacent to the cathode in the organic EL device.

The configuration, structure and size of the cathode are the same as those in the organic electroluminescent device according to the first aspect of the invention.

Examples of the material constituting the cathode include metals, alloys, metal oxides, conductive compounds and mixtures thereof.

Specific examples of the material constituting the cathode include alkali metals (for example Li, Na, K and Cs), alkali earth metals (for example Mg and Ca), gold, silver, lead, aluminum, sodium-potassium alloy, lithium-aluminum alloy, magnesium-silver alloy, and rare earth metals such as indium and ytterbium. While one of them may be used alone, a plurality of them may be favorably used in combination from the viewpoint of compatibility between stability and electron injectability.

Alkali metals and alkali earth metals are preferable among them as the material constituting the cathode with respect to injectability of electrons, while materials mainly comprising aluminum are preferable with respect to excellent storage stability.

The material mainly comprising aluminum refers to aluminum alone, and alloys of aluminum with an alkali metal or alkali earth metal in the range of 0.01 to 10% by mass (for example lithium-aluminum alloy and magnesium-aluminum alloy).

The materials of the cathode have been described in JP-A Nos. 2-15595 and 5-121172, and the materials described in these patent publications can be also used in the invention.

The method for forming the cathode and the position for forming the cathode are the same as in the organic luminescent device according to the first aspect of the invention.

A dielectric layer with a thickness of 0.1 to 3 nm containing an alkali metal or an alkali earth metal may be provided as an inorganic compound layer adjoining the cathode.

The dielectric layer is the same as that in the organic electroluminescent device according to the first aspect of the invention.

The work function of the material constituting the cathode layer is preferably in the range of 2.5 to 4.5 eV, more preferably 2.8 to 4.0 eV.

The thickness and configuration of the cathode is the same as those in the organic electroluminescent device according to the first embodiment of the invention. When the device comprises the cathode as well as an inorganic compound layer such as the dielectric layer, the thickness of the inorganic compound layer is usually in the range of about 0.1 to about 3 nm, preferably 0.5 to 2 nm.

The organic compound layer and the method for forming the organic compound layer are the same as those mentioned in the second embodiment, and others are the same as in the organic electroluminescent device described in the first aspect of the invention. The hole injection layer, hole-transport layer and protective layer are also the same as in the organic electroluminescent layer according to the first aspect of the invention. Sealing is also the same as in the organic electroluminescent layer according to the first aspect of the invention.

The above-mentioned organic electroluminescent device of the invention can emit a light by applying a direct current voltage (usually in the range of 2 to 15 volts; may contain an alternating current component, if necessary) or a direct current between the anode and cathode. The invention provides an organic electroluminescent device having high luminous efficiency, being able to drive at a low voltage, and being excellent in driving durability.

Driving methods described in JP-A Nos. 2-148687, 6-301355, 5-29080, 7-134558, 8-234685 and 8-241047, Japanese Patent No. 2784615, and U.S. Pat. Nos. 5,828,429 and 6,023,308 can be applied to the driving method of the organic electroluminescent device according to the invention.

Driving durability of the organic electroluminescent device of the invention can be measured by a half-life of luminance at a specified luminance. For example, the organic EL device is allowed to emit light by applying a direct current using a source measure unit type 2400, (manufactured by Keithley Co.), the device is subjected to a continuous driving test under a condition of an initial luminance of 1500 cd/m$^2$ with a constant current, and the time when a reduction in luminance exceeds 20% is measured. The value as described above is used as the driving durability in the invention.

External quantum efficiency as a light emission characteristic is simultaneously determined by measuring light quantity-current characteristics when above-mentioned driving durability is measured, and then external quantum efficiency is determined The organic EL device of the invention can be favorably used for a display device, display, back light, reading light source, electrophotography, illumination light source, recording light source, exposure light source, mark, signboard, interior and optical communication.

EXAMPLES

While the invention is described below with reference to examples, the invention is by no means restricted to these examples.

Comparative Example 1

An ITO thin film (with a thickness of 0.2 μm) as a transparent anode was deposited on a glass substrate with a thickness of 0.5 mm and a size of 2.5 cm square by DC magnetron sputtering (sputtering conditions: temperature of substrate of 100° C., oxygen pressure of $1 \times 10^{-3}$ Pa) using an ITO target with an $In_2O_3$ content of 95% by mass. The surface resistivity of the ITO thin film was 10 Ω/sq.

Then, the substrate having the deposited transparent anode thereon was placed in a washing vessel and was washed with IPA followed by UV-ozone treatment for 5 minutes. Copper phthalocyanine (CuPC) was deposited on the transparent anode as a hole injection layer with a thickness of 10 nm at a deposition rate of 0.1 nm/second by vacuum vapor deposition.

α-NPD ((N,N'-di-α-naphthyl-N,N'-diphenyl)-benzidine) was deposited on the hole injection layer by vacuum vapor deposition at a deposition rate of 0.3 nm/second as a hole-transport layer to provide a hole-transport layer with a thickness of 30 nm.

mCP as a host material in the luminescent layer and the following luminescent material Firpic as the luminescent material in the luminescent layer were co-deposited on the hole-transport layer by vacuum vapor deposition in a proportion of 100/5 to provide a luminescent layer with a thickness of 30 nm.

BAlq was deposited on the luminescent layer at a deposition rate of 0.2 nm/second by vacuum vapor deposition as an electron-transport layer A with a thickness of 10 nm, and $Alq_3$ was deposited thereon at a deposition rate of 0.2 nm/second by vacuum vapor deposition as electron-transport layer B with a thickness of 30 nm.

A patterned mask (a mask with a luminescent area of 2 mm×2 mm) was provided on the electron-transport layer B, and lithium fluoride was deposited by vacuum vapor deposition at a thickness of 1 nm. Aluminum was further deposited thereon by vacuum vapor deposition to provide a cathode with a thickness of 0.1 µm.

The luminescent laminate obtained was placed in a glove box substituted with argon gas, and sealed in a stainless steal can using a UV curable adhesive (trade name: XNR 5516HV, manufactured by Nagase Chiba Co.) in combination with a drying agent to obtain a luminescent device of Comparative Example 1.

The work from the vapor deposition of the copper phthalocyanine to the sealing was performed in a vacuum or in a nitrogen atmosphere in order to manufacture the device without it being exposed to air.

The construction of the luminescent device is shown below:

ITO/CuPC (10 nm)/NPD (30 nm)/mCP+Firpic (100:5, 30 nm)/BAlq (10 nm)/Alq (30 nm)/LiF (1 nm)/Al (100 nm)

Chemical formulae of NPD, mCP, Firpic, BAlq and ALq are shown below.

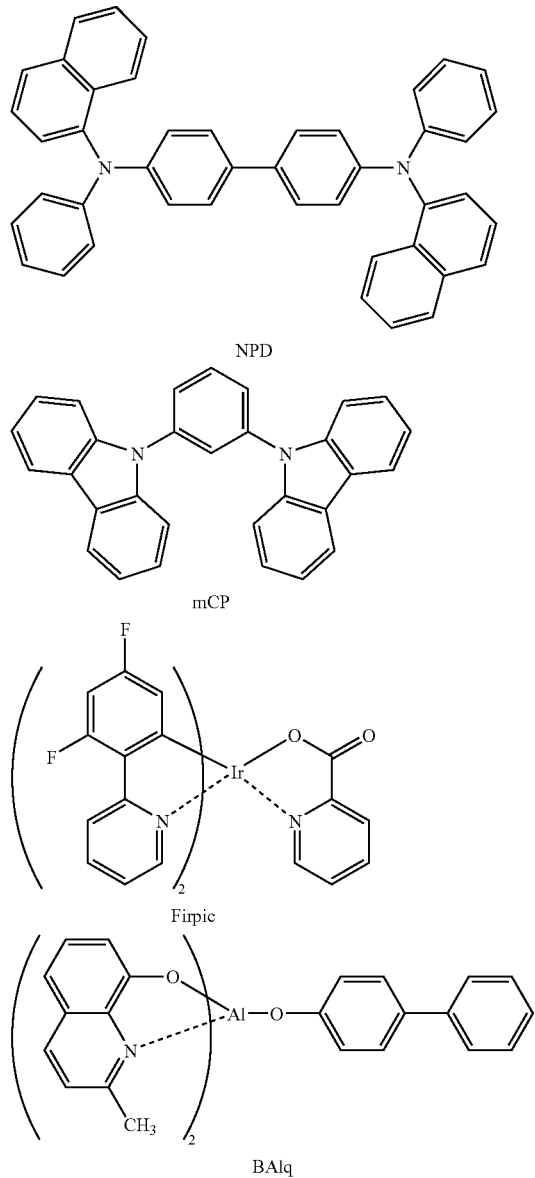

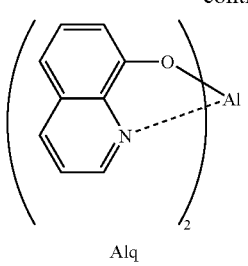

Alq

—Evaluation—

The thickness of each layer was measured for every vapor deposition of the layer on the glass substrate using a stylus surface configuration meter (trade name: DEKTAL, manufactured by ULVAC, Inc.). The results are shown in Table 1 below.

—Measurement of Electron Affinity—

A band gap was calculated from the long wavelength end of the absorption spectrum of each single layer film (single layer), and electron affinity ETL1 (Ea) of ETL1 layer and electron affinity ETL2 (Ea) of ETL2 layer were calculated using the band gap and ionization potential (Ip) of each layer measured with a UV photoelectron analyzer (trade name: AC-1, manufactured by Riken Keiki Co. Ltd.). The results are shown in Table 1 below.

The driving voltage, driving durability and luminous efficiency were measured using the luminescent device obtained as described above.

—Driving Voltage—

The driving voltage was defined as a voltage applied so that the current density of the luminescent device is a constant value of 1 A/cm$^2$.

—Driving Durability Test—

Driving durability was determined by measuring the time required for a 20% reduction in luminance by subjecting the device to a continuous drive test under a condition of an initial luminance of 1500 cd/m$^2$ with a constant current.

—External Quantum Efficiency—

External quantum efficiency was determined by measuring light quantity-current characteristics of the device when a voltage was applied to the luminescent device.

Comparative Example 2

The luminescent device of Comparative Example 2 was obtained by the same manufacturing method as manufacturing the device in Comparative Example 1, except that BCP in place of Alq was deposited by vacuum vapor deposition with a thickness of 30 nm at a deposition rate of 0.2 nm/second for forming electron-transport layer B, and the luminescent device was evaluated as in Comparative Example 1.

The construction of the luminescent device in Comparative Example 2 was as follows:

ITO/CuPC (10 nm)/NPD (30 nm)/mCP+Firpic (100:5, 30 nm)/BAlq (10 nm)/BCP (30 nm)/LiF (1 nm)/Al (100 nm)

The Chemical formula of BCP is shown below.

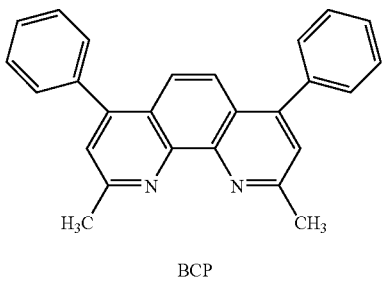

BCP

Example 1

The luminescent device in Example 1 was manufactured by the same manufacturing method as in Comparative Example 1, except that an electron-transport layer (ETL1 layer) with a thickness of 15 nm was provided by depositing BAlq at a deposition rate of 0.2 nm/second by vacuum vapor deposition and an organic thin film layer (ETL2 layer) with a thickness of 2 nm was provided by vacuum vapor deposition at a deposition rate of 0.05 nm/second in place of electron-transport layer A (Balq, 10 nm) and electron-transport layer B (Alq, 30 nm) in Comparative Example 1. The luminescent device was evaluated as in Comparative Example 1. The results are shown in Table 1 below.

The construction of the luminescent device in Example 1 is as follows:

ITO/CuPC (10 nm)/NPD (30 nm)/mCP+Firpic (100 nm)/ Balq (15 nm)/BCP (2 nm)/LiF (1 nm)/Al (100 nm)

Comparative Example 3

The luminescent device in Comparative Example 3 was obtained by the same manufacturing method as in Comparative Example 1, except that Ir(ppy)₃ was used for the luminescent layer in place of luminescent material A in Comparative Example 1, and the device was evaluated as in Comparative Example 1. The results are shown in Table 1.

The construction of the luminescent device in Comparative Example 3 is as follows:

ITO/CuPC (10 nm)/NPD (30 nm)/mCP+Ir(ppy)₃ (100:5, 30 nm)/BAlq (10 nm)/Alq (30 nm)/LiF (1 nm)/Al (100 nm)

The chemical formula of Ir(ppy)₃ is as follows.

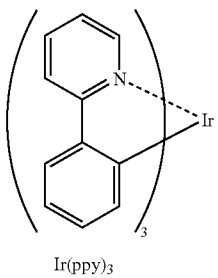

Ir(ppy)₃

Example 2

The luminescent device in Example 2 was manufactured by the same manufacturing method as in Comparative Example 2, except that an electron-transport layer (ETL1 layer) with a thickness of 25 nm was formed by depositing Balq by vacuum vapor deposition at a deposition rate of 0.2 nm/second in place of electron-transport layer A (Balq, nm) and electron-transport layer B (BCP, 30 nm) in Comparative Example 2, and an organic thin film layer (ETL2 layer) with a thickness of 0.05 nm was formed on the electron-transport layer by depositing BCP by vacuum vapor deposition at a deposition rate of 0.01 nm/second, and the device was evaluated as in Comparative Example 1. The results are shown in Table 1 below.

The construction of the luminescent device in Example 2 is shown below:

ITO/CuPC (10 nm)/NPD (30 nm)/mCP+Ir(ppy)₃ (100:5, 30 nm)/Balq (25 nm)/BCP (0.05 nm)/LiF (1 nm)/Al (100 nm)

Example 3

The luminescent device in Example 3 was obtained by the same manufacturing method as in Comparative Example 2, except that an electron-transport layer (ETL1 layer) with a thickness of 39 nm was provided by depositing BAlq at a deposition rate of 0.2 nm/second by vacuum vapor deposition in place of electron-transport layer A (BAlq, 10 nm) and electron-transport layer B (Alq, 30 nm) in Comparative Example 2, and an organic thin film layer (ETL2 layer) with a thickness of 1 nm was provided on the electron-transport layer by vacuum vapor deposition of BCP at a deposition rate of 0.05 nm/second, and the device was evaluated as in Comparative Example 1. The results are shown in Table 1 below.

The construction of the luminescent device in Example 3 is shown below:

ITO/CuPC (10 nm)/NPD (30 nm)/mCP+Ir(Ppy)₃ (100:5, 30 nm)/BAlq (39 nm)/BCP (1 nm)/LiF (1 nm)/Al (100 nm)

Example 4

The luminescent device in Example 4 was obtained by the same manufacturing method as in Comparative Example 1, except that an electron-transport layer (ETL1 layer) with a thickness of 39 nm was provided by depositing BAlq by vacuum vapor deposition at a deposition rate of 0.2 nm/second in place of electron-transport layer A (BAlq, 10 nm) and electron-transport layer B (Alq, 30 nm) in Comparative Example 1, and an organic thin film layer (ETL2 layer) with a thickness of 1 nm was provided by depositing Alq by vacuum vapor deposition at a deposition rate of 0.05 nm, and the device was evaluated as in Comparative example 1. The results are shown in Table 2 below.

The construction of the luminescent device in Example 4 is as follows:

ITO/CuPC (10 nm)/NPD (30 nm)/mCP+Firpic (100:5, 30 nm)/BAlq (39 nm)/Alq (1 nm)/LiF (1 nm)/Al (100 nm)

Comparative Example 4

The luminescent device in Comparative Example 4 was obtained by manufacturing the device as in Comparative Example 1, except that electron-transport layer C with a thickness of 1 nm was provided by depositing compound A described below between the luminescent layer and electron-transport layer A in Comparative Example 1 by vacuum vapor deposition at a deposition rate of 0.05 nm/second, and the device was evaluated as in Comparative Example 1. The results are shown in Table 2.

The construction of the luminescent device in Comparative Example 4 is shown below:

ITO/CuPC (10 nm)/NPD (30 nm)/mCP+luminescent material C (100:5 30 nm)/compound A (1 nm)/BAlq (10 nm)/Alq (30 nm)/LiF (1 nm)/Al (100 nm)

Compound A

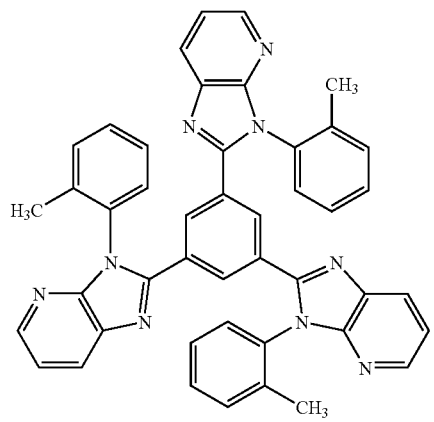

Example 5

A luminescent device in Example 5 was obtained by the same method as in Comparative Example 3 except that an electron-transport layer (ETL1 layer) with a thickness of 39 nm was provided by depositing BAlq by vacuum vapor deposition at a deposition rate of 0.2 nm in place of electron-transport layer A (BAlq, 10 nm) and electron-transport layer B (Alq, 30 nm) in Comparative Example 4, and an organic thin film layer (ETL2 layer) with a thickness of 1 nm was provided on the electron-transport layer by depositing BCP by vacuum vapor deposition at a deposition rate of 0.05 nm/second, and the device was evaluated as in Comparative Example 1. The results are shown in Table 2.

The construction of the luminescent device in Example 5 is shown below:

ITO/CuPc (10 nm)/NPD (30 nm)/mCP+Firpic (100:5, 30 nm)/compound A (1 nm)/BAlq (39 nm)/BCP (1 nm)/LiF (1 nm)/Al (100 nm)

Comparative Example 5

The device was manufactured by the same manufacturing method as in Comparative Example 1, except that a hole injection layer with a thickness of 160 nm was provided by co-vapor deposition of 2-TNATA and F4-TCQN in a proportion of 1000/3 by vacuum vapor deposition at a deposition rate of 0.5 nm/second, and a hole-transport layer with a thickness of 5 nm was provided by co-vapor deposition of NPD and F4-TCQN in a proportion of 1000/3 by vacuum vapor deposition at a deposition rate of 0.5 nm/second, in place pf the hole injection layer (copper phthalocyanine (CuPC), 10 nm) and hole-transport layer (NPD, 30 nm) in Comparative Example 1, and the device was evaluated as in Comparative Example 1. The results are shown in Table 2.

The construction of the luminescent device in Comparative Example 5 is shown below:

ITO/2-TNATA+F4-TCQN (1000:3, 160 nm)/NPDF+F4-TCQN (1000:3, 5 nm)/mCP+luminescent material E (100:5, 30 nm)/BAlq (10 nm)/Alq (30 nm)/LiF (1 nm)/Al (100 nm)

Example 6

A hole injection layer with a thickness of 160 nm was provided by co-vapor deposition of 2-TNATA and F4-TCQN in a proportion of 1000/3 by vacuum vapor deposition at a deposition rate of 0.5 nm/second, a hole-transport layer with a thickness of 5 nm was provided by co-vapor deposition of NPD and F4-TCQN in a proportion of 1000/3 by vacuum vapor deposition at a deposition rate of 0.5 nm/second in place of the hole injection layer (copper phthalocyanine (CuPC), 10 nm) and hole-transport layer (NPD, 30 nm). Subsequently, an electron-transport layer (ETL1 layer) with a thickness of 15 nm was provided by depositing BAlq by vacuum vapor deposition at a deposition rate of 0.1 nm/second in place of the electron-transport layer A (BAlq, 10 nm) and electron-transport layer B (Alq, 30 nm), and an organic thin film layer (ETL2 layer) with a thickness of 1 nm was provided on the electron-transport layer by depositing BCP by vacuum vapor deposition at a deposition rate of 0.05 nm/second. The device of Example 6 was manufactured by the same manufacturing method as in Comparative Example 1 except the above-mentioned procedures. The device was evaluated as in Comparative Example 1.

The construction of the luminescent device in Example 6 is shown below:

ITO/2-TNATA+F4-TCNQ (1000:3, 160 nm)/NPD+F4-TCNQ (1000:3, 5 nm)/mCP+luminescent material E (100:5. 30 nm)/BAlq (15 nm)/BCP (1 nm)/LiF (1 nm)/Al (1000 nm.

The chemical formula of 2-TNATA is as follows:

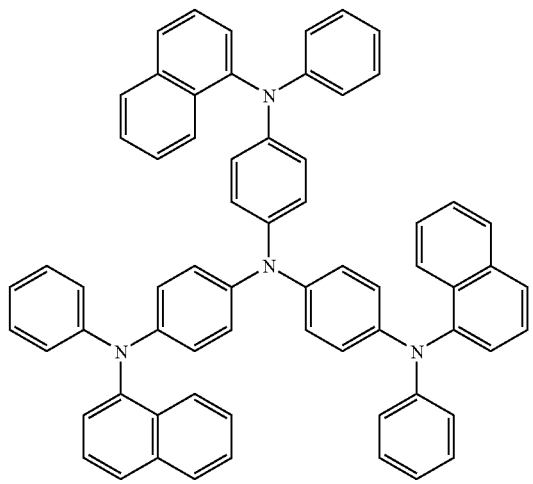

2-TNATA

TABLE 1

|  | Comparative Example 1 | Comparative Example 2 | Comparative Example 3 | Example 1 | Example 2 | Example 3 |
|---|---|---|---|---|---|---|
| Hole injecting layer/hole-transport layer | CuPC/NPD | CuPC/NPD | CuPC/NPD | CuPC/NPD | CuPC/NPD | CuPC/NPD |
| Luminescent layer   Host compound | mCP | mCP | mCP | mCP | mCP | mCP |
|                     Luminescent material | Firpic | Firpic | Ir(ppy)$_3$ | Firpic | Ir(ppy)$_3$ | Ir(ppy)$_3$ |
| electron-transport layer A or electron-transport layer (ETL1) (thickness: nm) | BAlq (10 nm) | BAlq (10 nm) | BAlq (10 nm) | BAlq (15 nm) | BAlq (25 nm) | BAlq (39 nm) |
| electron-transport layer B or organic thin film layer (ETL2) (thickness: nm) | Alq (30 nm) | BCP (30 nm) | Alq (30 nm) | BCP (2 nm) | BCP (0.05 nm) | BCP (1 nm) |
| Ratio of thickness (electron-transport layer A/electron-transport layer B or ETL1/ETL2) | 0.33 | 0.33 | 0.33 | 7.5 | 500 | 39 |
| Ea (eV) of electron-transport layer A or electron-transport layer (ETL1) | 2.9 | 2.9 | 2.9 | 2.9 | 2.9 | 2.9 |
| Ea (eV) of electron-transport layer B or organic thin film layer (ETL2) | 3.0 | 3.2 | 3.0 | 3.2 | 3.2 | 3.2 |
| Driving voltage (1 mA/cm$^2$/hour) | 9.5 V | 8.7 V | 10.2 V | 7.2 V | 7.5 V | 7.0 V |
| Durability* | 46 h | 33 h | 42 h | 70 h | 68 h | 65 h |
| External quantum efficiency (%) | 5.49% | 8.5% | 5.3% | 12.13% | 11.25% | 10.1% |

Durability denotes a time when the amount of decay of luminance exceeds 20% from an initial luminance 1500 cd/m2 · hour.

TABLE 2

|  | Comparative Example 4 | Comparative Example 5 | Example 4 | Example 5 | Example 6 |
|---|---|---|---|---|---|
| Hole injecting layer/hole-transport layer | CuPC/NPD | 2-TNATA + F4-TCNQ/ NPD + F4-TCNQ | CuPC/NPD | CuPC/NPD | 2-TNATA + F4-TCNQ/ NPD + F4-TCNQ |
| Luminescent layer   Host compound | mCP | mCP | mCP | mCP | mCP |
|                     Luminescent material | Firpic | Firpic | Firpic | Firpic | Firpic |
| electron-transport layer C | Compound A | — | — | Compound A | — |
| electron-transport layer A or electron-transport layer (ETL1) (thickness: nm) | BAlq (10 nm) | BAlq (10 nm) | BAlq (39 nm) | BAlq (39 nm) | BAlq (15 nm) |
| electron-transport layer B or organic thin film layer (ETL2) (thickness: nm) | Alq (30 nm) | Alq (30 nm) | Alq (1 nm) | BCP (1 nm) | BCP (1 nm) |
| Ratio of thickness (electron-transport layer A/electron-transport layer B or ETL1/ETL2) | 0.33 | 0.33 | 39 | 39 | 15 |
| Ea (eV) of electron-transport layer A or electron-transport layer (ETL1) | 2.9 | 2.9 | 2.9 | 2.9 | 2.9 |
| Ea (eV) of electron-transport layer B or organic thin film layer (ETL2) | 3.0 | 3.0 | 3.0 | 3.2 | 3.2 |
| Driving voltage (1 mA/cm$^2$/hour) | 8.5 V | 7.1 V | 8.5 V | 6.7 V | 6.5 V |
| Durability* | 50 h | 72 h | 75 h | 81 h | 80 h |
| External quantum efficiency (%) | 5.72% | 10.93% | 10.83% | 11.56% | 13.93% |

Durability denotes a time when the amount of decay of luminance exceeds 20% from an initial luminance 1500 cd/m$^2$ · hour.

Tables 1 and 2 show that the luminescent device of the examples of the invention comprising the electron-transport layer (ETL1) and organic thin film layer (ETL2) each of which has a thickness within the range of the invention has high external quantum efficiency, is able to drive at a low driving voltage and is an device excellent in driving durability.

Comparative Example 6

The luminescent device of Comparative Example 6 was obtained by the same manufacturing method as in Comparative Example 1, except that electron-transport layer B was provided followed by providing a patterned mask (a mask having a luminescent area of 2 mm×2 mm) on the electron-transport layer, and a cathode layer with a thickness of 100 nm was provided by depositing aluminum by vacuum vapor deposition.

The construction of the luminescent layer in Comparative Example 6 is shown below:

ITO/CuPC (10 nm)/NPD (30 nm)/mCP+Firpic (100:5, 30 nm)/BAlq (10 nm)/Alq (30 nm)/Al (100 nm)

Evaluation
—Measurement of Thickness—
The thickness of each layer was measured by the same method as in Comparative Example 1. The results are shown in Table 3 below.
—Measurement of Electron Affinity—
Electron affinity (Ea) of electron-transport layer A or ETL1 layer, and electron affinity (Ea) of electron-transport layer B or ETL2 layer were calculated by the same method as in Comparative Example 1. The results are shown in Table 3 below.

The driving voltage, driving durability and external quantum efficiency were measured using the luminescent device obtained as described above.
—Driving Voltage—
The driving voltage was defined as the voltage applied so that the current density of the luminescent device is a constant value of 1 mA/cm$^2$.
—Driving Durability Test—
The current was adjusted so that initial luminance of the luminescent device is 1500 cd/m$^2$, and the device was subjected to a continuous drive test under the condition of constant current density. The time required for 20% reduction of luminance was defined as driving durability.

—External Quantum Efficiency—

Luminous energy-current characteristics of the device were measured, and luminous efficiency (external quantum efficiency (%) was calculated).

Example 7

An device was manufactured by the same manufacturing method as in Comparative Example 6, except that an electron-transport layer (ETL1 layer) with a thickness of 15 nm was provided by depositing Balq by vacuum vapor deposition at a deposition rate of 0.2 nm/second in place of electron-transport layer A (Balq, 10 nm) and electron-transport layer B (Alq, 30 nm) in Comparative Example 6, and an organic thin film layer (ETL2 layer) with a thickness of 2 nm was provided by a compound B as a pyrene derivative (hereinafter, abbreviated as "compound B") by vacuum vapor deposition at a deposition rate of 0.05 nm on the electron-transport layer, and the device was evaluated as in Comparative Example 6. The results are shown in Table 3 below.

The construction of the luminescent device in Example 7 is shown below:

ITO/CuPC (10 nm)/NPD (30 nm)/mCP+Firpic (100:5, 30 nm)/Balq (15 nm)/compound B (2 nm)/Al (100 nm)

Compound B

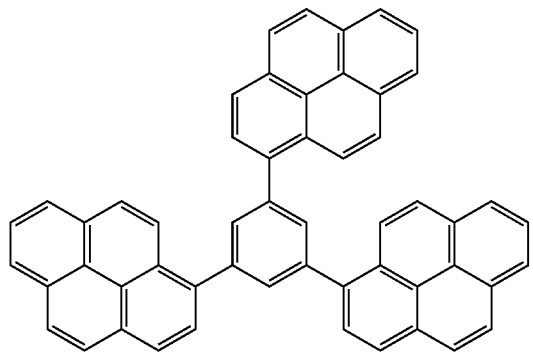

Example 8

The luminescent device in Example 8 was obtained by the same manufacturing method as in Example 7, except that ETL1 layer (Balq, 15 nm) and ETL2 layer (compound B, 2 nm) were changed to ETL1 layer (Alq, 25 nm) and ETL2 layer (compound B, 0.05 nm), respectively, and the device was evaluated as in Comparative Example 6. The results are shown in Table 3 below.

The construction of the luminescent device in Example 8 is shown below:

ITO/CuPC (10 nm)/NPD (30 nm)/mCP+Firpic (100:5, 30 nm)/Alq (25 nm)/compound B (0.05 nm)/Al (100 nm)

Example 9

The luminescent device in Example 9 was obtained by the same manufacturing method as in Example 7, except that ETL1 layer (Balq, 15 nm) and ETL2 layer (compound B, 2 nm) in Example 7 were changed to ETL1 layer (Balq, 35 nm) and ETL2 layer (compound A of an imidazopyridine derivative, 0.5 nm), respectively, and the device was evaluated as in Comparative example 6. The results are shown in Table 3 below.

The construction of the luminescent device in Example 9 is shown below:

ITO/CuPC (10 nm)/NPD (30 nm)/mCP+Firpic (100:5. 30 nm)/Balq (35 nm)/compound A (0.5 nm)/Al (100 nm)

Example 10

The luminescent device in Example 10 was obtained by the same manufacturing method as in Example 7, except that ETL1 layer (Balq, 10 nm) and ETL2 layer (compound B, 0.05 nm) in Example 7 were changed to ETL1 layer (Balq, 10 nm) and ETL2 layer (compound C of a carbazole derivative (hereinafter, abbreviated as compound C), 0.5 nm), respectively, the device was evaluated as on Comparative Example 6. The results are shown in Table 3 below.

The construction of the luminescent device in Example 10 is as follows:

ITO/CuPC (10 nm)/NPD (30 nm)/mCP+luminescent material A (100:5, 30 nm)/Balq (10 nm)/compound C (0.5 nm)/Al (100 nm)

Compound C
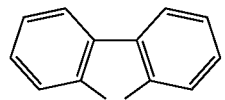
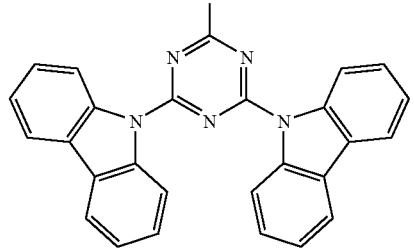

Example 11

The luminescent device of Example 11 was obtained by the same manufacturing method of the device in Example 7, except that ETL1 layer (BAlq, 15 nm) and ETL2 layer (compound B. 0.05 nm) in Example 7 were changed to ETL1 layer (BAlq, 39 nm) and ETL2 layer (compound B, 1 nm), respectively, and the device was evaluated as in Comparative Example 6. The results are shown in Table 3. The construction of the luminescent device in Example 11 is shown below:

ITO/CuPC (10 nm)/NPD (30 nm)/mCP+Firpic (100:5, 30 nm)/BAlq (39 nm)/compound B (1 nm)/Al (100 nm)

Example 12

The device in Example 12 was obtained by the same manufacturing method as in Example 7, except that ETL1 layer (BAlq, 15 nm) and ETL2 layer (compound B, 0.05 nm) in Example 7 were changed to ETL1 layer (BAlq, 50 nm) and ETL2 layer (compound B, 1 nm), respectively, and the device was evaluated as in Comparative Example 6. The results are shown in Table 3 below.

The construction of the luminescent device in Example 12 is shown below:

ITO/CuPC (10 nm)/NPD (30 nm)/mCP+Firpic (100:5, 30 nm)/BAlq (50 nm)/compound B (1 nm)/Al (100 nm)

Comparative Example 7

A luminescent layer with a thickness of 30 nm was provided by co-depositing mCP as the host material in the luminescent layer and Ir(ppy)$_3$ as the luminescent material in the luminescent layer in a proportion of 100/5 by vacuum vapor deposition in place of the luminescent layer (mCP+Firpic, 30 nm) in Comparative Example 6. The device in Comparative Example 7 was obtained the same manufacturing method as in Comparative Example 6, except that the cathode layer with a thickness of 100 nm was provided by co-deposition of a lithium-aluminum alloy (an alloy containing 0.6% of lithium in aluminum) by vacuum vapor deposition at a deposition rate of 0.3 nm/second in place of the cathode layer (Al, 1000 nm), and the device was evaluated as in Comparative Example 6. The results are shown in Table 4 below.

The construction of the luminescent device in Comparative Example 7 is shown below:
ITO/CuPC (10 nm)/NPD (30 nm)/mCP+Ir(ppy)$_3$ (100:5, 30 nm)/BAlq (10 nm)/Alq (30 nm)/Li—Al (100 nm)

Example 13

The luminescent device in Example 13 was obtained by the same manufacturing method as in Comparative Example 7, except that electron-transport layer A (BAlq, 10 nm) and electron-transport layer B (Alq, 30 nm) in Comparative example 7 were changed to ETL1 layer (BAlq, 39 nm) and ETL2 layer (metal complex A described below, 1 nm), respectively, with elimination of LiF, and the device was evaluated as in Comparative Example 6. The results are shown in Table 4 below.

The construction of the luminescent device in Example 13 is shown below:
ITO/CuPC (10 nm)/NPD (30 nm)/mCP+Ir(ppy)$_3$ (100:5, 30 nm)/BAlq (39 nm)/metal complex A (1 nm)/Li—Al (100 nm)

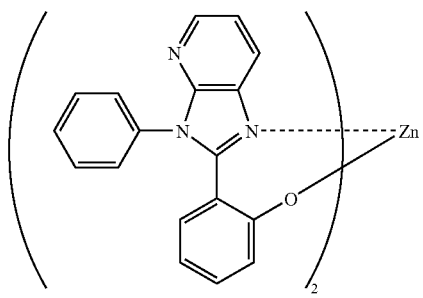

Metal Complex A

Comparative Example 8

A hole injection layer with a thickness of 100 nm was provided by co-depositing 2-TNATA and F4-TCQN in a proportion of 1000/3 by vacuum vapor deposition at a deposition rate of 0.5 nm/second, and a hole-transport layer with a thickness of 10 nm was provided by co-depositing NPD and F4-TCQN in a proportion of 1000/3 by vacuum vapor deposition at a deposition rate of 0.5 nm/second in place of the hole injection layer (copper phthalocyanine (CuPC), 10 nm) and hole injection layer (NPD, 30 nm) in Comparative Example 6, respectively. A luminescent layer with a thickness of 30 nm was provided by co-depositing mCP as a host material in the luminescent layer and Ir(ppy)$_3$ as a luminescent material in the luminescent layer in a proportion of 100/5 in place of the luminescent layer (mCP+Firpic, 30 nm). A cathode layer comprising a layer formed by depositing lithium fluoride at a thickness of 1 nm by vacuum vapor deposition and a layer formed by depositing aluminum at a thickness of 100 nm by vacuum vapor deposition on the above-mentioned layer was further formed in place of the cathode layer (Al, 100 nm). The luminescent device in Comparative Example 8 was obtained by the same manufacturing method of the device as in Comparative example 6 except the procedures as described above. The device was evaluated as in Comparative Example 6. The results are shown in Table 4 below.

The construction of the luminescent device in Comparative Example 8 is shown below:
ITO/2-TNATA+F4-TCQN (1000:3, 100 nm)/NPD+F4-TCQN (1000:3, 10 nm)/mCP+Ir(ppy)$_3$ (100:5, 30 nm)/BAlq (10 nm)/Alq (30 nm)/LiF (1 nm)/Al (100 nm)

The chemical formula of F4-TCQN is as follows:

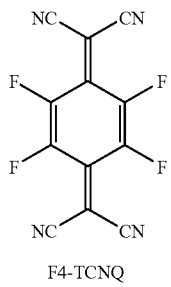

F4-TCNQ

Example 14

The luminescent device in Example 14 was obtained by the same manufacturing method as in Comparative Example 8, except that the electron-transport layer A (BAlq, 10 nm) and electron-transport layer B (Alq, 30 nm) in Comparative Example 8 were changed to ETL1 layer (BAlq, 39 nm) and ETL2 layer (metal complex A, 1 nm), respectively. The device was evaluated as in Comparative example 6. The results are shown in Table 4 below.

The construction of the luminescent device in Example 14 is shown below:
ITO/2-TNATA+F4-TCQN (1000:3, 100 nm)/NPD+F4-TCQN (1000:3, 10 nm)/mCP+Ir(Ppy)$_3$ (100:5, 30 nm)/BAlq (39 nm)/metal complex A (1 nm)/LiF (1 nm)/Al (100 nm)

TABLE 3

| | Comparative Example 6 | Example 7 | Example 8 | Example 9 | Example 10 | Example 11 | Example 12 |
|---|---|---|---|---|---|---|---|
| Hole injecting layer/hole-transport layer | CuPC/NPD | CuPC/NPD | CuPC/NPD | CuPC/NPD | CuPC/NPD | CuPC/NPD | CuPC/NPD |
| Luminescent layer  Host compound | mCP | mCP | mCP | mCP | mCP | mCP | mCP |
| Luminescent material | Firpic | Firpic | Firpic | Firpic | Firpic | Firpic | Firpic |
| electron-transport layer A or electron-transport layer (ETL1) (thickness: nm) | BAlq (10 nm) | BAlq (15 nm) | BAlq (25 nm) | BAlq (35 nm) | BAlq (10 nm) | BAlq (39 nm) | BAlq (50 nm) |

TABLE 3-continued

| | Comparative Example 6 | Example 7 | Example 8 | Example 9 | Example 10 | Example 11 | Example 12 |
|---|---|---|---|---|---|---|---|
| Ea of electron-transport layer A or electron-transport layer (ETL1) | 2.9 eV | 2.9 eV | 2.9 eV | 2.9 eV | 2.9 eV | 2.9 eV | 2.9 eV |
| electron-transport layer B or organic thin film layer (ETL2) (thickness: nm) | Alq (30 nm) | Compound A (2 nm) | Compound A (0.05 nm) | Compound B (0.5 nm) | Compound C (0.5 nm) | Compound A (1 nm) | Compound A (1 nm) |
| Ea of electron-transport layer B or organic thin film layer (ETL2) | 30 eV | 2.7 eV | 2.7 eV | 2.8 eV | 2.5 eV | 2.7 eV | 2.7 eV |
| Ratio of thickness (electron-transport layer A/electron-transport layer B or ETL1/ETL2) | 0.33 | 7.5 | 500 | 70 | 20 | 39 | 50 |
| Cathode layer (thickness: nm) | Al (100 nm) | Al (100 nm) | Al (100 nm) | Al (100 nm) | Al (100 nm) | Al (100 nm) | Al (100 nm) |
| Work function of cathode layer material | 4.3 eV | 4.3 eV | 4.3 eV | 4.3 eV | 4.3 eV | 4.3 eV | 4.3 eV |
| Driving voltage (1 mA/cm$^2$/hour) | 25.2 V | 20.5 V | 20.4 V | 21.0 V | 20.6 V | 20.4 V | 20.3 V |
| Durability* | 46 h | 70 h | 72 h | 82 h | 79 h | 92 h | 89 h |
| External quantum efficiency (%) | 2.45% | 3.54% | 3.77% | 3.62% | 3.22% | 3.41% | 3.67% |

Durability denotes a time when the amount of decay of luminance exceeds 20% from an initial luminance 1500 cd/m$^2$ · hour.

TABLE 4

| | Comparative Example 7 | Example 13 | Comparative Example 8 | Example 14 |
|---|---|---|---|---|
| Hole injecting layer/hole-transport layer | CuPC/NPD | CuPC/NPD | 2-TNANA + F4-TCNQ/NPD | 2-TNANA + F4-TCNQ/NPD |
| Luminescent layer  Host compound | mCP | mCP | mCP | mCP |
| Luminescent material | Ir(ppy)$_3$ | Ir(ppy)$_3$ | Ir(ppy)$_3$ | Ir(ppy)$_3$ |
| electron-transport layer A or electron-transport layer (ETL1) (thickness: nm) | BAlq (10 nm) | BAlq (39 nm) | BAlq (10 nm) | BAlq (39 nm) |
| Ea of electron-transport layer A or electron-transport layer (ETL1) | 2.9 eV | 2.9 eV | 2.9 eV | 2.9 eV |
| electron-transport layer B or organic thin film layer (ETL2) (thickness: nm) | Alq (30 nm) | Metal complex A (1 nm) | Alq (30 nm) | Metal complex A (1 nm) |
| Ea of electron-transport layer B or organic thin film layer (ETL2) | 30 eV | 2.8 eV | 3.0 eV | 2.8 eV |
| Ratio of thickness (electron-transport layer A/electron-transport layer B or ETL1/ETL2) | 0.33 | 39 | 0.33 | 39 |
| Cathode layer (thickness: nm) | Li—Al (100 nm) | Li—Al (100 nm) | LiF (1 nm) Al (100 nm) | LiF (1 nm) Al (100 nm) |
| Work function of cathode layer material | 3.2 eV | 3.2 eV | 3.2 eV | 3.2 eV |
| Driving voltage (1 mA/cm$^2$/hour) | 8.2 V | 7.3 V | 14.4 V | 12.0 V |
| Durability* | 80 h | 95 h | 45 h | 71 h |
| External quantum efficiency (%) | 7.92% | 11.03% | 8.11% | 12.51% |

Durability denotes a time when the amount of decay of luminance exceeds 20% from an initial luminance 1500 cd/m$^2$ · hour.

As shown in Tables 3 and 4, the luminescent device of the invention having the electron-transport layer (ETL1) and organic thin film layer (ETL2) with the ratio of thickness and the ratio of Ea between these layers within the range of the invention has high external quantum efficiency, is able to drive at a low voltage, and is excellent in driving durability.

The foregoing description of the embodiments of the present invention has been provided for the purposes of illustration and description. It is not intended to be exhaustive or to limit the invention to the precise forms disclosed. Obviously, many modifications and variations will be apps rent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. An organic electroluminescent device comprising a luminescent layer containing a luminescent material, an electron-transport layer (ETL1) and an organic thin film layer (ETL2) in this order from an anode side between a pair of electrodes, wherein:
    the organic thin film layer (ETL2) contains an electron transporting material and has a thickness of 0.01 to 3 nm;
    the ratio (ETL1/ETL2) of the thickness of the electron-transport layer (ETL1) to the thickness of the organic thin film layer (ETL2) is in the range of 5 to 500;
    an electron affinity (ETL1 (Ea)) of the electron-transport layer (ETL1) and an electron affinity (ETL2 (Ea)) of the organic thin film layer (ETL2) satisfy the relationship represented by the following equation (2); and
    the organic thin film layer (ETL2) is adjacent to a cathode layer:

$$ETL1(Ea) > ETL2(Ea) \qquad (2)$$

wherein an electron transporting material contained in the electron-transport layer (ETL1) is a metal complex of an 8-quinolinol derivative, and the electron transporting material contained in the organic thin film layer (ETL2) is a metal complex containing at least one of bipyrene, carbazole, imidazopyridine, a derivative thereof, or a derivative of 2-(2-phenolato)imidazopyridine.

2. The organic electroluminescent device of claim 1, wherein the work function of a material constituting the cathode layer is in the range of 2.5 to 4.5 eV.

3. The organic electroluminescent device of claim 1, wherein the ratio (ETL1/ETL2) of the thickness of ETL1 to the thickness of ETL2 is in the range of 7 to 70.

4. The organic electroluminescent device of claim 1, wherein the ratio (ETL1/ETL2) of the thickness of ETL1 to the thickness of ETL2 is in the range of 10 to 50.

5. The organic electroluminescent device of claim 1, wherein the organic thin film layer (ETL2) contains at least one selected from pyrene, carbazole, imidazopyridine, a derivative thereof, or a metal complex thereof.

6. The organic electroluminescent device of claim 1, wherein the electron-transport layer (ETL1) contains a metal complex.

* * * * *